(12) United States Patent
Noda

(10) Patent No.: US 7,264,994 B2
(45) Date of Patent: Sep. 4, 2007

(54) METHOD OF FABRICATING A SEMICONDUCTOR DEVICE

(75) Inventor: Takatoshi Noda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 366 days.

(21) Appl. No.: 11/109,933

(22) Filed: Apr. 20, 2005

(65) Prior Publication Data
US 2005/0245003 A1   Nov. 3, 2005

(30) Foreign Application Priority Data
Apr. 27, 2004   (JP) ............................. 2004-131109

(51) Int. Cl.
*H01L 21/00* (2006.01)
(52) U.S. Cl. .................... 438/106; 438/15; 438/16; 257/432; 257/E29.167
(58) Field of Classification Search ................ 438/15, 438/16, 106; 257/432, E29.167
See application file for complete search history.

(56) References Cited

U.S. PATENT DOCUMENTS

| | | | | |
|---|---|---|---|---|
| 5,059,559 A | * | 10/1991 | Takahashi et al. | 228/105 |
| 6,562,637 B1 | * | 5/2003 | Akram et al. | 438/14 |
| 6,812,061 B1 | * | 11/2004 | Feierabend et al. | 438/106 |

FOREIGN PATENT DOCUMENTS

| | | |
|---|---|---|
| JP | 09-209970 | 8/1997 |
| JP | 2709631 | 10/1997 |
| JP | 11-113239 | 4/1999 |
| JP | 2001-179700 | 7/2001 |
| JP | 2003-188193 | 7/2003 |

* cited by examiner

*Primary Examiner*—Michelle Estrada
*Assistant Examiner*—Nicholas Tobergte
(74) *Attorney, Agent, or Firm*—Finnegan, Henderson, Farabow, Garrett & Dunner, L.L.P.

(57) ABSTRACT

A package substrate is placed in a first predetermined position on a supporting equipment. A chip guide equipment and a magnetic-field-generating equipment in a second predetermined position are placed near the package substrate. A semiconductor chip having a photoelectric element and a solenoid electrically connected to the photoelectric element in a surface region of the semiconductor chip is placed on the package substrate with the surface region facing away from the package substrate. The photoelectric element of the semiconductor chip is exposed to light so as to move the semiconductor chip toward the chip guide equipment by an interaction between a first magnetic field of the solenoid and a second magnetic field of the magnetic-field-generating equipment. A manufacturing step to the semiconductor chip is performed while keeping the position of the semiconductor chip near the chip guide equipment.

20 Claims, 9 Drawing Sheets

METHOD OF FABRICATING A SEMICONDUCTOR DEVICE

CROSS REFERENCE TO RELATED APPLICATION

This application is based upon and claims the benefit of priority from the prior Japanese Patent Application No. 2004-131109, filed on Apr. 27, 2004; the entire contents of which are incorporated herein by reference.

FIELD OF THE INVENTION

The present invention relates to a method of fabricating a semiconductor device, and more particularly, relates to an improved method including a step of positioning a semiconductor device in a predetermined position on a package substrate.

DESCRIPTION OF THE BACKGROUND

A semiconductor device contains a semiconductor chip. The chip is a main portion of the device. The semiconductor chip has various elements, wiring patterns, functional blocks, bonding pads and the others. A semiconductor wafer is prepared when the semiconductor chip is manufactured. After a semiconductor wafer manufacturing process is completed, the wafer is separated by cutting or dicing to be individual chips (an individual separation), and, for example, the semiconductor chip is bonded on a package substrate such as a lead frame or an interposer. The bonding pads on a surface of the semiconductor chip bonded on the lead frame are connected to the lead frame by wires. The semiconductor chip, a portion of the lead frame, the wires, and others are molded by resin.

Japanese Patent Laid-Open No. 2003-188193 discloses a conventional method of fixing a semiconductor chip in a predetermined position on a lead frame. According to Japanese Patent Laid-Open No. 2003-188193, a semiconductor wafer with an adhesive tape is separated by cutting to semiconductor chips, and the adhesive tape with the semiconductor chips is placed on a chip supply table. The chip should be correctly placed in a predetermined position so that it is placed in the correct position under a bonding operation. An image of the semiconductor chip which is to be bonded is captured on the adhesion tape by a chip recognition camera over the semiconductor chip. The image is compared with that of a reference chip placed in a reference position captured beforehand Then a difference in position between the semiconductor chip and the reference chip is calculated. A position of an adsorption nozzle of a conveyance mechanism is corrected based on the difference, then the adsorption nozzle is moved to the position of the semiconductor chip, and the semiconductor chip is adsorbed. The adsorbed semiconductor chip is moved to and placed over the predetermined position of the lead frame by an arm of the conveyance mechanism movable in three dimensions (X, Y and Z). The adsorbed semiconductor chip is moved down and reaches on the lead frame, and it is bonded to the lead frame with an adhesive material.

After the semiconductor chip has been positioned before being adsorbed, the position of the semiconductor chip may not be checked or corrected until it is released, since the adsorption nozzle may interrupt the field of view of the chip recognition camera while the semiconductor chip is being adsorbed. That is, after increasing inaccuracy of the position, the semiconductor chip adheres to the lead frame.

It is difficult to adsorb semiconductor chips consistently in the same position of a tip of the adsorption nozzle under reduced pressure, as an air flow occurs and it often shifts a semiconductor chip in an unspecified direction from a predetermined position. Therefore, the adhered semiconductor chip may be shifted from the predetermined position of the lead frame. This unintentional shift affects the ensuing processes. At a wire-bonding process, for example, corrections of bonding positions based on the shift of the semiconductor chip become necessary. This correction process may require an increased process time and may result in an increase in defective wire-bonding.

Moreover, in order to recognize the position of the semiconductor chip, the method of fixing the semiconductor chip requires that images of the reference chip beforehand be captured and recorded, and that the most suitable image be selected and compared with the image of the semiconductor chip. And whenever images of semiconductor chips change, an excess process time when images of the related reference chips are captured become necessary.

Certain methods for positioning a semiconductor device in a predetermined position on a package substrate are known. Japanese Patent No. 2709631 describes a photoelectromagnetic device having a photoelectric element to convert optical signals into current signals and a magnetic path in which magnetic flux is produced by passing the current signals in a thin film coil.

Japanese Patent Laid-Open No. H9-209970 describes a fluid driving method and device changing periodically directions of magnetic lines of force by passing current on a coil and switching the direction of the current periodically.

Japanese Patent Laid-Open No. 2001-179700 describes a movement control system of a micro machine having a magnetic field generation unit which generates a rotating field and performing a directional control by magnetic field change means.

Japanese Patent Laid-Open No. H11-113239 describes a linear motor having coils approximately equalized amount of reverse electromotive current generated in each coil when the parallel-connection coils move relatively in a magnetic field.

These conventional approaches use magnetic fields as driving forces. However, there is no teaching or suggestion of applying them to move a semiconductor chip itself to a predetermined position.

SUMMARY OF THE INVENTION

One aspect of the present invention is to provide a method of fabricating a semiconductor device containing a semiconductor chip comprises placing a package substrate in a first predetermined position on a supporting equipment, placing a chip guide equipment and a magnetic-field-generating equipment in a second predetermined position near the package substrate, placing on the package substrate a semiconductor chip having a photoelectric element and a solenoid electrically connected to the photoelectric element in a surface region of the semiconductor chip, with the surface region facing away from the package substrate, exposing the photoelectric element of the semiconductor chip to light so as to move the semiconductor chip toward the chip guide by an interaction between a first magnetic field of the solenoid and a second magnetic field of the magnetic-field-generating equipment and performing a manufacturing step to the semiconductor chip while keeping the position of the semiconductor chip near the chip guide equipment.

Another aspect of the present invention is to provide a method of fabricating a semiconductor device containing a semiconductor chip comprises placing a chip guide equipment and a magnetic-field-generating equipment in a predetermined position on or near a supporting equipment, placing on the supporting equipment a semiconductor chip having a photoelectric element and a solenoid electrically connected to the photoelectric element in a surface region of the semiconductor chip, and a bump on the surface region, with the surface region facing away from the supporting equipment, exposing the photoelectric element of the semiconductor chip to light so as to move the semiconductor chip toward the chip guide equipment by an interaction between a first magnetic field of the solenoid and a second magnetic field of the magnetic-field-generating equipment, and performing a manufacturing step to the semiconductor chip while keeping the position of the semiconductor chip near the chip guide equipment.

BRIEF DESCRIPTION OF THE DRAWINGS

FIG. 6B is a plan view of the same relationship as FIG. 6A after that.

FIG. 10B is a plan view of the same relationship as FIG. 10A after that.

FIG. 11A is a simplified perspective view showing a positioning mechanism of a semiconductor chip and its related parts used in the third embodiment of the present invention.

DETAILED DESCRIPTION OF THE EMBODIMENT

Figure 1:
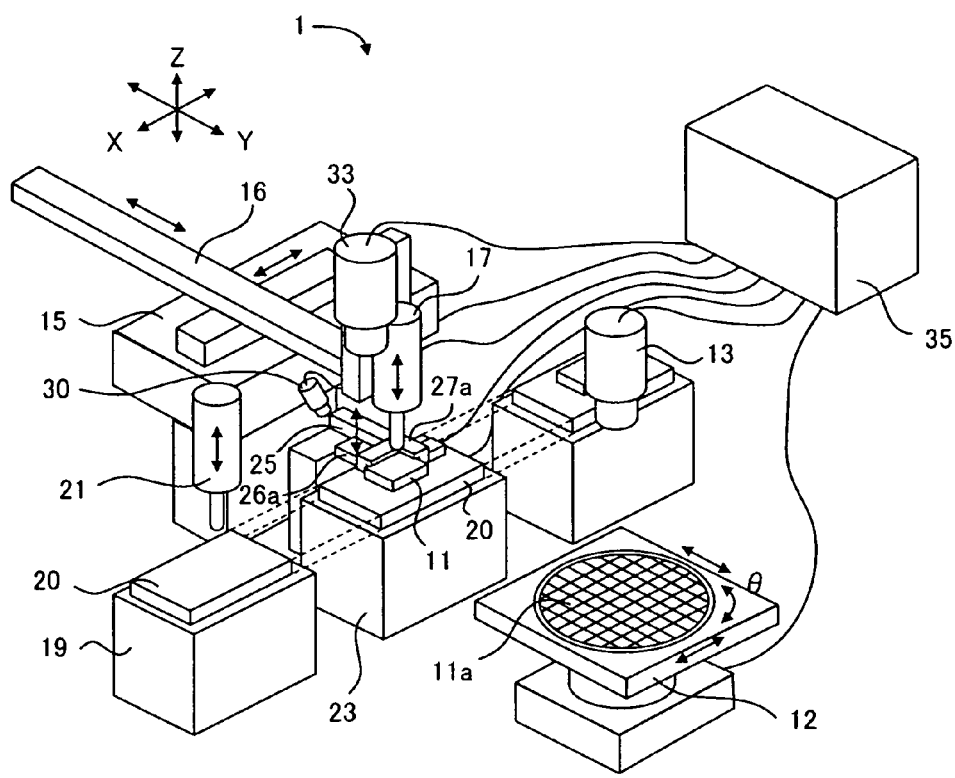
FIG. 1 is a perspective view of semiconductor chip-bonding equipment used in a first embodiment of a method in accordance with the present invention.

Embodiments of this invention will be explained with reference to the drawings. In the drawings, the same reference numerals and marks are given to the corresponding components, and semiconductor chips may be drawn larger than actual sizes to emphasize the embodiments.

A first embodiment in accordance with the present invention will be explained with reference to FIG. 1 through FIG. 6. FIG. 1 is a perspective view of semiconductor chip-bonding equipment, i.e. semiconductor die-bonding equipment.

As shown in FIG. 1, semiconductor chip-bonding equipment 1 includes a chip supply table 12, on which a semiconductor wafer having a plurality of semiconductor chips 11a is prepared, and a chip recognition camera 13 which monitors a position of each of the semiconductor chips 11a on the chip supply table 12. Each of the semiconductor chips 11a has a photoelectric element and a solenoid in a surface region as described below. The semiconductor chip-bonding equipment 1 also includes a coating mechanism 21 and a conveyance mechanism 15. The coating mechanism 21 applies adhesives (not shown in the figure) to a position that a semiconductor chip 11 is to be placed on a package substrate, i.e. a lead frame 20, and the conveyance mechanism 15 has an arm 16 which conveys the semiconductor chip 11 onto the lead frame 20 on a piece of supporting equipment such as a bonding table 23. The bonding table 23 may already have been prepared (provided) or may newly be prepared (provided) in the chip-bonding equipment 1.

The semiconductor chip-bonding equipment 1 also includes a positioning mechanism 25 and an irradiation mechanism 30. The positioning mechanism 25 has magnetic-field-generating equipment such as electromagnets 26a and 26b for moving the semiconductor chip 11 using magnetic fields, referred to as first magnetic fields, generated in the solenoids in the semiconductor chip 11, and the irradiation mechanism 30 has a lighting apparatus which supplies light energy to be converted into magnetic energy in the semiconductor chip 11. And the semiconductor chip-bonding equipment 1 also includes a bonding monitor camera 33 and a controller 35. The bonding monitor camera 33 monitors chip bonding, and the controller 35 controls the above-mentioned mechanisms and apparatus and others, and supplies power to them.

The connections of the controller 35 and the main components are shown in FIG. 1. Control information and/or pictures through controller 35 are outputted to a monitor (not shown in the figure). The following is explained by using a direction of X as an extension direction of the lead frame 20, using a direction of Y as an extension direction of an arm 16, and using a direction of Z as a direction perpendicular to the horizontal plane which consists of the X direction and the Y direction, as shown in FIG. 1.

Figure 2A:
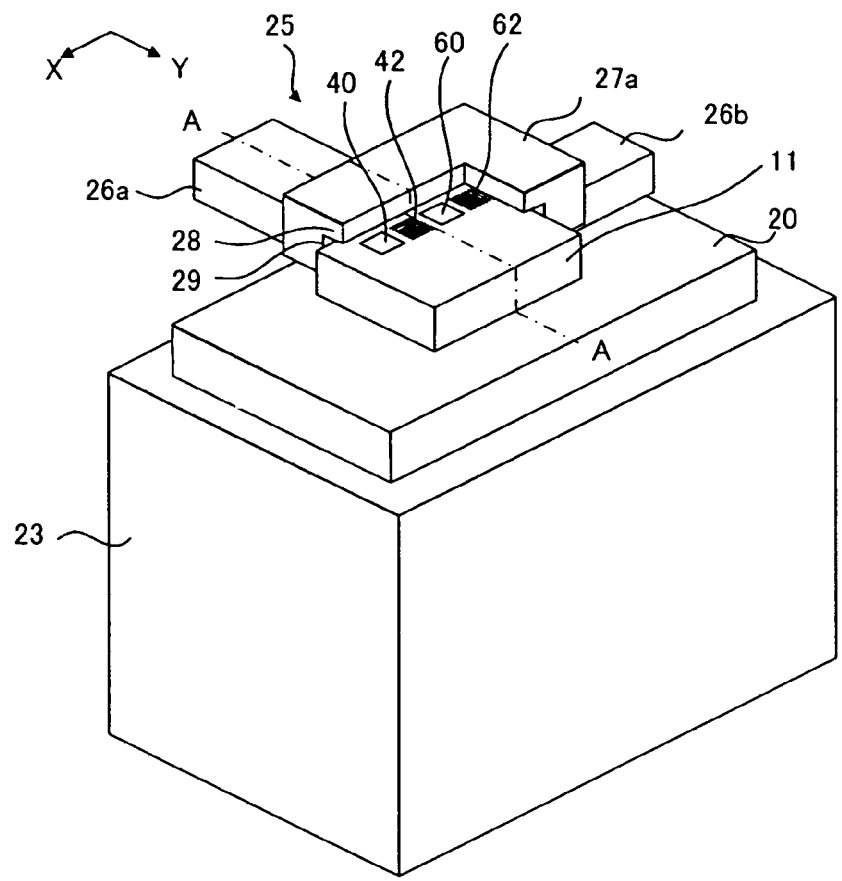
FIG. 2A is a simplified perspective view showing a positioning mechanism of a semiconductor chip and its related parts used in the first embodiment of the present invention.
Figure 2B:
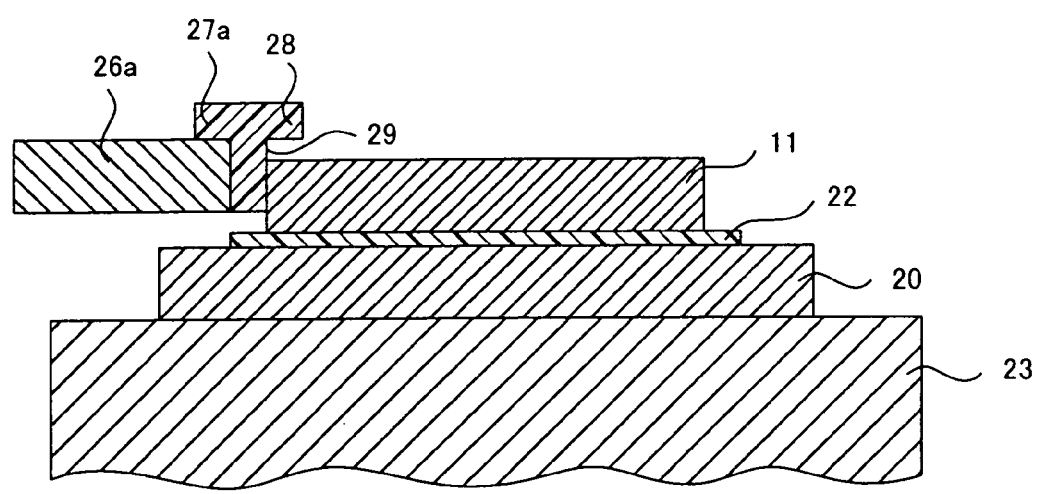
FIG. 2B is a sectional view along a dashed dotted line (A-A) portion of FIG. 2A.

The positioning mechanism 25 will be explained. FIG. 2A and FIG. 2B are a simplified perspective view and a sectional view which show the positioning mechanism 25 of the semiconductor chip 11. As shown in FIG. 2A and FIG. 2B, the lead frame 20 is located on the bonding table 23, an adhesive 22 is supplied on the lead frame 20 where the semiconductor chip 11 is to be placed. The semiconductor chip 11 is placed on the adhesive 22. Chip guide equipment such as an L-shaped chip guide 27a, which is, for example, made of resin material, extends in the X direction and the Y direction, and defines a reference position, i.e. a first predetermined position, for positioning the semiconductor chip 11. The chip guide 27a is arranged above the semiconductor chip 11. A guide side 29 of the chip guide 27a has two surfaces for contacting two adjacent sides of the semiconductor chip 11. The chip guide 27a also has eaves 28 projected over the guide side 29, and the eaves 28 extend above a surface region in which elements of the semiconductor chip 11 are formed. The eaves 28 may prevent certain movements of the semiconductor chip 11 such as jumping up from the surface of the lead frame 20. Therefore if such movements of the semiconductor chip 11 are not expected, the eaves 28 may not be necessary.

The two electromagnets 26a and 26b face each of the faces of the guide side 29 respectively, and are perpendicular to each other. Each of the electromagnets 26a and 26b contains a solenoid (not shown in the figure) inside. Through the controller 35, poles of the electromagnets 26a and 26b can be changed by changing current directions and magnetic field strengths of the electromagnets 26a and 26b can be changed by changing amount of the currents. The electromagnets 26a and 26b are placed on the opposite side of the solenoids 42 and 62 formed in the surface region of the semiconductor chip 11, respectively. Here, a solenoid is defined as a component containing one or more coils.

By contacting the two sides of the semiconductor chip 11 or keeping a certain distance from them, the guide side 29 sets the semiconductor chip 11 in a position where the semiconductor chip 11 should be placed on the lead frame 20 i.e. on the X-Y plane.

Figure 3:
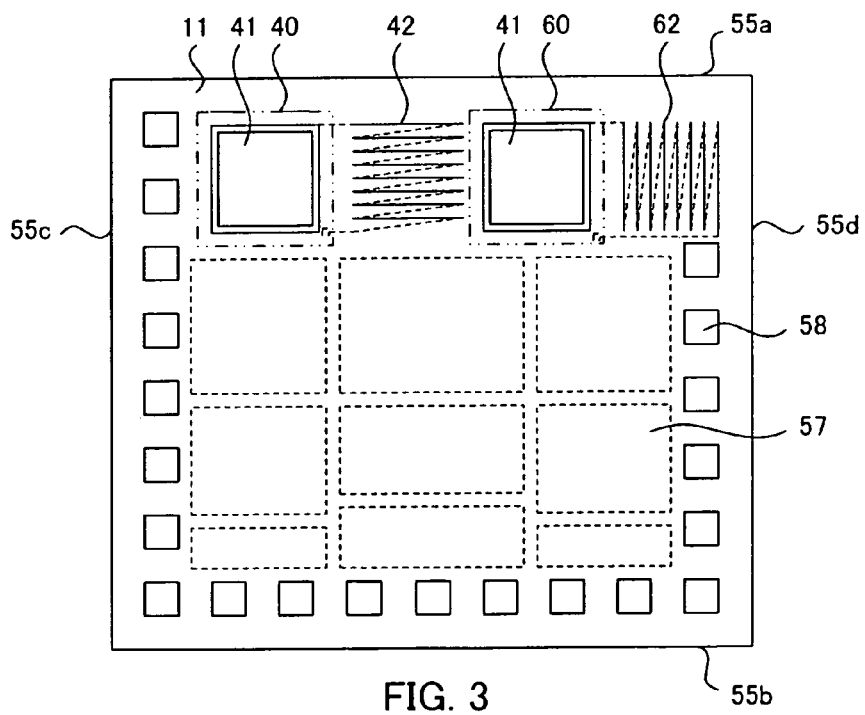
FIG. 3 is a plan view of the semiconductor chip used in the first embodiment of the present invention.

Elements in the surface region of the semiconductor chip 11 will now be explained. FIG. 3 is a plan view of the surface region of the semiconductor chip 11. As shown in FIG. 3, first and second photoelectric elements 40 and 60 which generate driving forces for positioning the semiconductor chips, first and second solenoids 42 and 62 electrically connected to the elements 40 and 60, respectively, functional blocks 57, bonding pads 58, etc. are formed in the surface region of the semiconductor chip 11. The semiconductor chip 11 has four sides such as an upside 55a, a downside 55b, a left-hand side 55c and a right-hand side 55d as shown in FIG. 3. A pair of the first photoelectric element 40 and the first solenoid 42 are located close to the upside 55a and the left-hand side 55c, and a pair of the second photoelectric element 60 and the second solenoid 62 are located close to the upside 55a and the right-hand side 55c. The first and second solenoids 42 and 62 next to the first and second photoelectric elements 40 and 60, respectively, are formed to face against the electromagnets 26a and 26b of the positioning mechanism 25 shown in FIG. 2. Directions of the magnetic fields generated inside the first and second solenoids 42 and 62 have the relation which may cross at 90 degrees mutually. Now that a direction of a magnetic field means a direction of magnetic lines of force. Coils of the first and second solenoids 42 and 62 have a depth in a direction from the surface to the bottom of the semiconductor chip 11, and solid lines and dashed lines show shallower portions of the coils and deeper portions of the coils, respectively.

A light-sensitive area 41 of the first photoelectric element 40 is formed in the position at which a light reaches from the outside, and the first photoelectric element 40 will generate current when the light is applied. The solenoid 42 passed this current generates a magnetic field. Then the direction of the magnetic field inside the solenoid 42 is toward the downside 55b, that is S pole of the solenoid 42 is toward the upside 55a. Similarly, the direction of the magnetic field inside the solenoid 62 is toward the right-hand side 55d, that is N pole of the solenoid 62 is toward the right-hand side 55d.

Figure 4A:
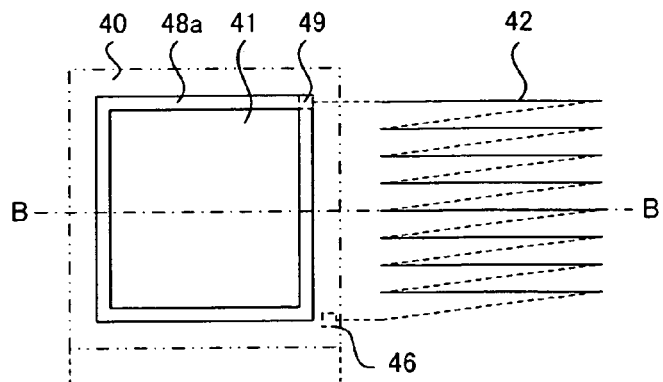
FIG. 4A is a plan view which shows a first photoelectric element and a first solenoid in the semiconductor chip of FIG. 3.
Figure 4B:
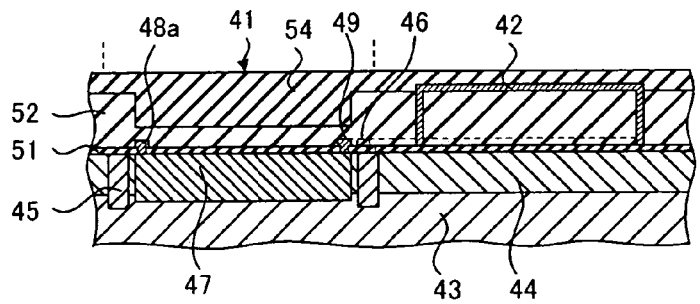
FIG. 4B is a sectional view along a dashed dotted line (B-B) portion of FIG. 4A.

The plane and the cross-sectional structures of the first photoelectric element 40 and the first solenoid 42 will now be explained. FIG. 4A and FIG. 4B are a plan view and a sectional view, respectively, which show the first photoelectric element 40 and the first solenoid 42 on a semiconductor substrate 43. The first photoelectric element 40 has a rectangular light-sensitive area 41 which can absorb visible light and near-infrared light and generate hole-electron pairs, and has an n-side electrode 48a which is formed with a metal, such as aluminum, copper and the like, around the light-sensitive area 41. The photoelectric element 40 including a p+ region 45 is an area bounded laterally by a dashed double-dotted line shown in FIG. 4A.

An approximate one-turn (coil) of the solenoid 42 approximately forms a framed rectangle shown in FIG. 4B, and the framed rectangle is approximately parallel to the upside 55a of the semiconductor chip 11 in FIG. 3. The shallower portions shown by solid lines of the solenoid 42 are virtually parallel to the upside 55a. On the other hand, the deeper portions (dashed lines) of the solenoid 42 are slightly tilted so as to connect to the adjacent shallower portions. Accordingly, the dashed lines are approximately parallel to the upside 55a. The intermediate portions between the shallower portions and the deeper portions of the solenoid 42 are formed to be perpendicular to the top of the surface region of the semiconductor chip 11. Since coil pitches, or the shortest distances between the shallower portions, of the solenoid 42 are sufficiently small, the magnetic field generated inside the solenoid 42 crosses at almost right angles to the upside 55a, i.e. substantially parallel to the right-hand side 55d, of the semiconductor chip 11. By the way, an alternative (not shown in the figure) for the solenoid 42 may be adopted. The alternative, for example, has each coil formed with the shallower portion, the intermediate portions, and an alternative portion corresponding to the deeper portion. Most of the alternative portion is parallel to the upside 55a and the rest of it is not parallel to the upside 55a to be connected to an adjacent coil. In this case, the magnetic field generated inside the alternative solenoid may cross at right angles to the upside 55a of the semiconductor chip 11.

As shown in FIG. 4B, an n type epitaxial layer 44 is formed on the p type semiconductor substrate 43. An n+ layer 47, the shape of which is a rectangle viewed from a point over the surface region of the semiconductor chip 11, is formed and extends from the surface of the epitaxial layer 44 to the semiconductor substrate 43 in the light-sensitive area 41. The boundary in the comparatively deep position between the n+ region 47 and the semiconductor substrate 43 is a pn junction. A p+ region 45 is a cylindrical shape, and extends from the epitaxial layer 44 surface to the semiconductor substrate 43 around the periphery of the n+ region 47.

An end of the solenoid 42 is connected to the n-side electrode 48a via a contact 49, and the other end is connected to the p+ region 45, which is a p-side electrode, via a contact 46. The solenoid 42 occupies an area which is nearly equivalent to that of the photoelectric element 40. Dimensions of the solenoid 42 may depend on a magnitude of required magnetic field.

The deeper portions of the solenoid 42 are formed on an oxidization film 51 on the epitaxial layer 44 using the lowest, or the deepest, wiring layer. The shallower portions of the solenoid 42 are formed on an interlayer insulating film 52 using the highest, or the shallowest, wiring layer. The intermediate portions between them are formed vertically through the interlayer insulating film 52 using via plugs of wiring. So the solenoid 42 is made of a conductive material such as aluminum, copper, tungsten and the like. And now, the interlayer insulating film 52 may be a monolayer, or may consist of two or more layers. And a passivation film 54 is formed on the interlayer insulating film 52, and the thickness of the passivation film 54 in the light-sensitive area 41 is arranged to have higher degree of transmissivity for visible and near-infrared light.

Since a longer-wavelength light of, for example, near-infrared ranging from 0.8 μm to 1.0 μm in wavelength irradiated onto the photoelectric element 40 penetrates deeper to the silicon layers, most of light is absorbed by the p type semiconductor substrate 43 through the n+ region 47 and contributes to a photoelectric conversion current. On the other hand, since a shorter-wavelength light is comparatively absorbed at the shallower region of the n+ region 47, it reduces the contribution to the photoelectric conversion current. The photoelectric element 40 may have relatively higher sensitivity to near-infrared light. If the near-infrared light is irradiated, the current more efficiently generated by the photoelectric element 40 may flow between the contact 46 and the contact 49 via the solenoid 42. The current flows from the contact 46 to the contact 49 in the solenoid 42.

Figure 5A:
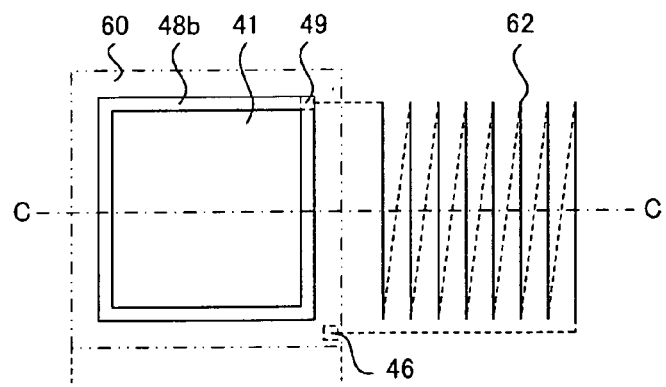
FIG. 5A is a plan view which shows a second photoelectric element and a second solenoid in the semiconductor chip of FIG. 3.
Figure 5B:
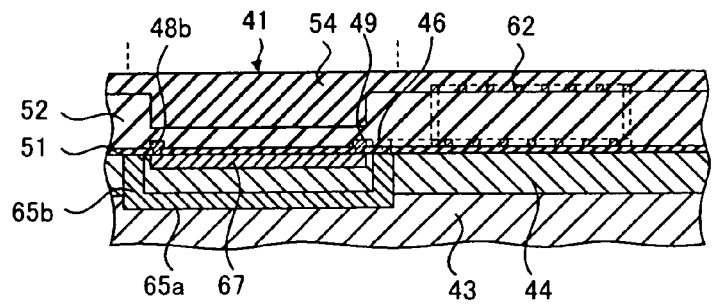
FIG. 5B is a sectional view along a dashed dotted line (C-C) portion of FIG. 5A.

The plane and the cross-sectional structure of the second photoelectric element 60 and the second solenoid 62 will be explained. FIG. 5A and FIG. 5B are a plan view and a sectional view, respectively, which show the second photoelectric element 60 and the second solenoid 62 on the semiconductor substrate 43. As shown in FIG. 5A, the photoelectric element 60, such as a photovoltaic device, is formed on the left-hand side, and the solenoid 62 spirally rolled is formed on the right-hand side. The photoelectric element 60 has the rectangular light-sensitive area 41 which can absorb visible light and near-infrared light and generate hole-electron pairs, and has an n-side electrode 48b which is formed with a metal, such as aluminum, copper and the like, around the light-sensitive area 41. The photoelectric element 60 including an n+ region 65a and 65b is an area bounded laterally by a dashed double-dofted line shown in FIG. 5A.

An approximate one-turn (coil) of the solenoid 62 approximately forms a framed rectangle viewed from the right-hand side 55d of the semiconductor chip 11 in FIG. 3, and the framed rectangle is approximately parallel to the right-hand side 55d. The shallower portions shown by solid lines of the solenoid 62 are virtually parallel to the right-hand side 55d. On the other hand, the deeper portions shown by dashed lines of the solenoid 62 are slightly tilted so as to connect to the adjacent shallower portions. Accordingly, the dashed lines are approximately parallel to the right-hand side 55d. The intermediate portions between the shallower portions and the deeper portions of the solenoid 62 are formed to be perpendicular to the top of the surface region of the semiconductor chip 11. Since coil pitches, or the shortest distances between the shallower portions, of the solenoid 62 are sufficiently small, the magnetic field generated inside the solenoid 62 crosses at almost right angles to the right-hand side 55d, i.e. substantially parallel to the upside 55a, of the semiconductor chip 11. Directions of the magnetic fields generated inside the first and second solenoids 42 and 62 have the relation which crosses at substantially 90 degrees mutually. By the way, an alternative (not shown in the figure) for the solenoid 62 may be adopted. The alternative, for example, has each coil formed with the shallower portion, the intermediate portions, and an alternative portion corresponding to the deeper portion. Most of the alternative portion is parallel to the right-hand side 55d and the rest of it is not parallel to the right-hand side 55d to be connected to an adjacent coil. In this case, the magnetic field generated inside the alternative solenoid may cross at right angles to the right-hand side 55d of the semiconductor chip 11.

As shown in FIG. 5B, an n type epitaxial layer 44 is formed on the p type the semiconductor substrate 43. An p+ layer 67, the shape of which is a rectangle viewed from a point over the surface region of the semiconductor substrate 43, is formed and extends from the surface of the epitaxial layer 44 to the semiconductor substrate 43 in the light-sensitive area 41. The boundary in the comparatively shallow position between the p+ region 67 and the epitaxial layer 44 is a pn junction. The n+ region 65b is a cylindrical shape, and extends from the epitaxial layer 44 surface to the semiconductor substrate 43 around the periphery of the p+ region 67. The n+ region 65b has a bottom of the n+ region 65a in the epitaxial layer 44.

An end of the solenoid 62 is connected to the p-side electrode 48b via a contact 49, and the other end is connected to the n+ region 65a which is a n-side electrode via a contact 46. The solenoid 62 occupies an area which is nearly equivalent to that of the photoelectric element 60. And now, dimensions of the solenoid 62 may depend on a magnitude of required magnetic field.

The oxidization film 51, the solenoid 60, the interlayer insulating film 52, the passivation film 54, etc. formed on the epitaxial layer 44 are the same as the constitution shown in FIG. 4.

Since a shorter-wavelength or a visible light of, for example, green (around 0.5 μm in wavelength) through red (around 0.6 μm in wavelength) irradiated onto the photoelectric element 60 penetrates shallower to the silicon layers, most of the light is absorbed by the n type epitaxial layer 44 through the p+ region 67 and contributes to a photoelectric conversion current. On the other hand, since a longer-wavelength light penetrates deeper through the epitaxial layer 44, it reduces the contribution to the photoelectric conversion current. The photoelectric element 60 may have relatively higher sensitivity to visible light. If the visible light is irradiated, the current more efficiently generated by the photoelectric element 60 may flow between the contact 46 and the contact 49 via the solenoid 62. The current flows from the contact 49 to the contact 46 in the solenoid 62.

Semiconductor elements, wiring layers, etc., in addition to the elements described above, may be formed in the semiconductor chip 11. Therefore the epitaxial layer 44, the p+ region 45 and 67, the n+ region 47, 65a and 65b, the oxide film 51, the interlayer insulating film 52, etc. may be the same as those of what are used for the other semiconductor elements, the other wiring layers, etc.

Operation of the semiconductor chip-bonding equipment 1 by which bonding of the semiconductor chip 11 is carried out on the lead frame 20 is outlined using FIG. 1 or FIG. 2. The semiconductor wafer (not shown in the figures) is provided onto an adhesive tape (not shown in the figures) after a semiconductor wafer manufacturing process is completed and is cut to separated the semiconductor chips 11. The semiconductor chips 11a which is on an adhesive tape (not shown in the figures) attached a ring-like frame is laid on the chip supply table 12 which is placed horizontally. The chip supply table 12 which has an X-Y-theta table is movable in the horizontal plane and can be rotated along the vertical Z-axis.

One of the semiconductor chips 11a on the chip supply table 12 in a face-up configuration which turned up the surface region in which semiconductor elements, wiring, bonding pads, etc. were formed is moved in accordance with a predetermined distance on the X-Y plane and a predetermined rotation angle. Consequently, the semiconductor chip 11 is placed in the center of the visual field of the chip recognition camera 13. Since the center of the adsorption nozzle 17 installed at the tip of the arm 16 of the conveyance mechanism 15 is almost in the center of the visual field of the chip recognition camera 13, the semiconductor chip 11 may be adsorbed with the adsorption nozzle 17. A precise position adjustment between the semiconductor chip 11 and the adsorption nozzle 17 is not necessary.

The surface region of the semiconductor chip 11 is adsorbed with the adsorption nozzle 17, and the semiconductor chip 11 is separated from the adhesive tape. The semiconductor chip 11 adsorbed is lifted, and is horizontally moved. Then the semiconductor chip 11 stops at right above the position on which the semiconductor chip 11 should be placed. The position is on the lead frame 20 on the bonding table 23 which is almost arranged horizontally. The semiconductor chip 11 is moved to approach the position, and is released on the adhesive 22 applied on the lead frame 20 from the adsorption nozzle 17. Then, the adsorption nozzle 17 moves to a position which does not interrupt a radiation field of the irradiation mechanism 30 or a viewing field of the bonding monitor camera 33.

The paste-like adhesive 22, which is, for example, a thermosetting epoxy resin, etc., is applied by the coating mechanism 21 beforehand to the position on which the semiconductor chip 11 should be placed of the lead frame 20 on the coating table 19. The coating table 19 is arranged almost horizontally. Then, the lead frame 20 is conveyed on the bonding table 23 from the coating table 19. The horizontal position of the lead frame 20 on the X-Y plane is decided on the coating table 19 and the bonding table 23, for example, using positioning pins or positioning holes (not shown in the figure), etc. The lead frame 20 may be a long sheet which is longer than a distance between the coating table 19 and the bonding table 23.

The semiconductor chip 11 placed on the paste-like adhesive 22 is horizontally movable. The positioning mechanism 25 adjacent to the bonding table 23 is fixed to the bonding table 23, and the electromagnets 26a and 26b and the chip guide 27a are arranged close to a position, i.e. a second predetermined position, on which the semiconductor chip 11 should be placed. The chip guide 27a with the electromagnets 26a and 26b may be placed near the lead frame 20, i.e. may be touched the lead frame 20 or may be placed at a distance which is within a thickness of the semiconductor chip 11. The electromagnets 26a and 26b and the chip guide 27a are movable in the vertical direction.

Figure 6A:
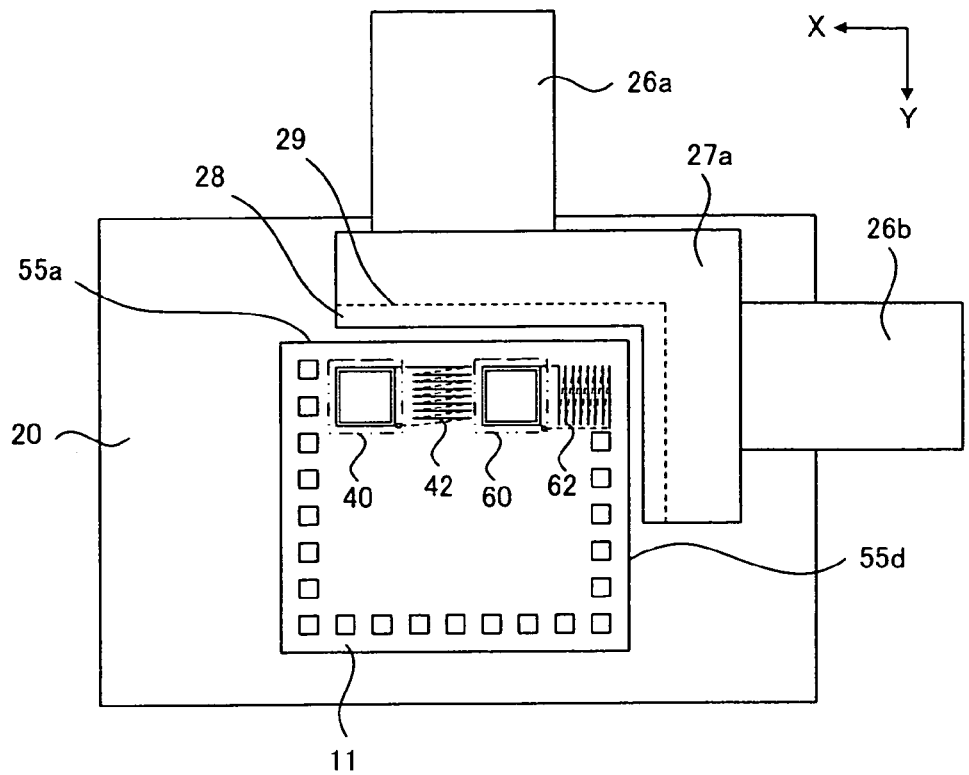
FIG. 6A is a plan view which shows a relationship between the semiconductor chip and a chip guide before the semiconductor chip is moved and positioned on a lead frame.
Figure 6B:
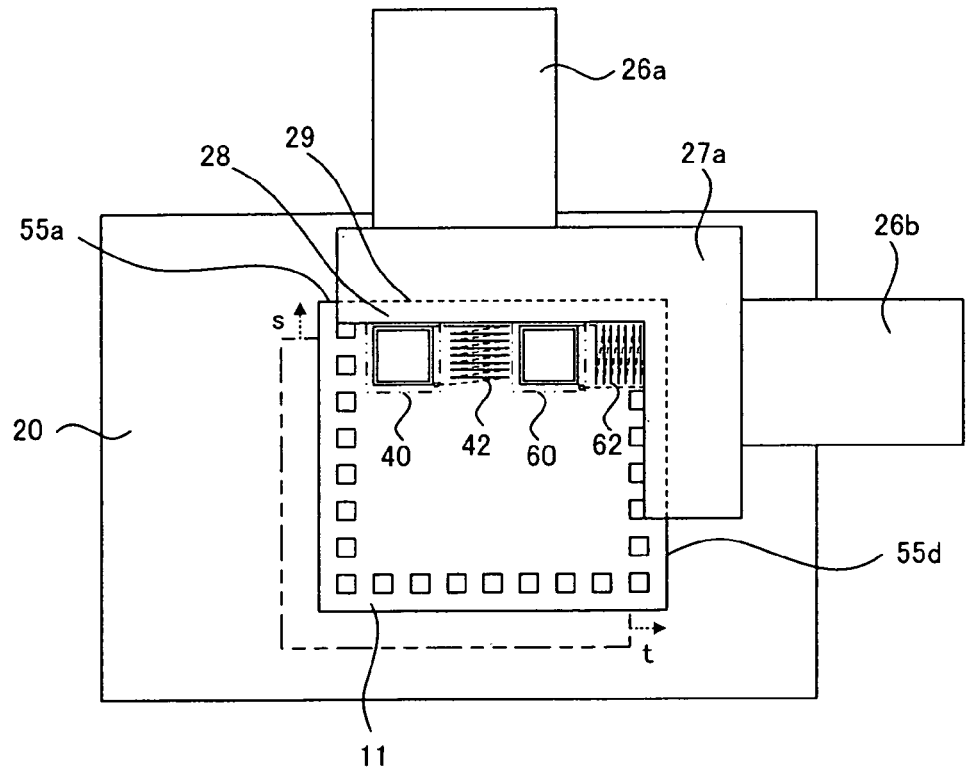

Method and operation with which the semiconductor chip 11 is moved using magnetic fields and set at a predetermined position on the lead frame 20 will be explained. FIG. 6A is a plan view which shows a relationship between the semiconductor chip 11 and the chip guide 27a before the semiconductor chip 11 is moved and positioned on the lead frame 20. FIG. 6B is a plan view of the same relationship as FIG. 6A after that. As shown in FIG. 6A, the semiconductor chip 11 is conveyed onto the paste-like adhesive (not shown in the figure) on the lead frame 20 according to the conveyance mechanism 15, and is laid close to the guide side 29 below the L-shaped eaves 28.

The first solenoid 42 of the semiconductor chip 11 has S pole close to the upside 55a of the semiconductor chip 11 or in a direction to the electromagnet 26a, and an end, which is attached to the chip guide 27a, of the electromagnet 26a which is opposed to the first solenoid 42 is set to be N pole. The second solenoid 62 of the semiconductor chip 11 has N pole close to the right-hand side 55d of the semiconductor chip 11 or in a direction to the electromagnet 26b, and an end, which is attached to the chip guide 27a, of the electromagnet 26b which is opposed to the second solenoid 62 is set to be S pole.

The semiconductor chip 11 is irradiated with the near-infrared light by the irradiation mechanism 30, while a current is passed on the electromagnet 26a. The S pole generated in the first solenoid 42 can be attracted to the electromagnet 26a. Therefore the semiconductor chip 11 is moved toward the electromagnet 26a and stopped by the guide side 29 which is extended in the vertical (Y) direction of the chip guide 27a.

The semiconductor chip 11 is irradiated with the visible light by the irradiation mechanism 30, while a current is passed on the electromagnet 26b. The N pole generated in the second solenoid 62 can be attracted to the electromagnet 26b. Therefore the semiconductor chip 11 is moved toward the electromagnet 26b and stopped by the guide side 29 which is extended in the horizontal (X) direction of the chip guide 27a.

As a result of the continuous operations, as shown in FIG. 6B, the semiconductor chip 11 moves by a distance s in the direction of −Y and a distance t in the direction of −X to the guide side 29 extended in the vertical (Y) direction and the horizontal (X) direction of the chip guide 27a, and the semiconductor chip 11 is stopped by the faces of the guide side 29. As a result of the continuous operations, however, if the semiconductor chip 11 could not touch the faces of the guide side 29, or separates from the faces of the guide side 29 after hitting them, by repeating the continuous operations the semiconductor chip 11 may touch the faces of the guide side 29. Moreover, it is also possible to move the semiconductor chip 11 by switching between the infrared light and the visible light of the irradiation mechanism 30 while the currents are passed on both the electromagnets 26a and 26b.

The semiconductor chip 11 in contact with the guide side 29 is bonded to the lead frame 20 by heating and hardening the adhesive 22 with a heating mechanism (not shown in the figure) in the upper surface of the bonding table 23.

If the semiconductor chip 11 touches both the faces of the guide side 29, a distance between the solenoid 42 and the opposed electromagnet 26a and a distance between the solenoid 62 and the opposed electromagnet 26b become approximately shortest, respectively. Simultaneous lighting of both the lights of the irradiation mechanism 30 and simultaneous passing on both the electromagnets 26a and 26b may strongly attract each other and strongly move the semiconductor chip 11 to both the faces of the guide side 29 accordingly. Therefore it may be allowed to light simultaneously both the lights of the irradiation mechanism 30 and to pass simultaneously on both the electromagnets 26a and 26b while the adhesive 22 is heated and hardened.

The lead frame 20 to which the semiconductor chip 11 is bonded is conveyed to a following process, for example, a wire bonding process, after the electromagnet 26a and 26b, the chip guide 27, etc. are removed upward, i.e. to the Z direction. Positioning operations of the semiconductor chip 11 may be checked with the bonding monitor camera 33.

As mentioned above, the lead frame 20 is placed in the predetermined position on the bonding table 23. The chip guide 27a and the electromagnets 26a and 26b in the predetermined position are placed near the lead frame 20. The semiconductor chip 11 having the first and second photoelectric elements 40 and 60 and the solenoids 42 and 62 electrically connected to the first and second photoelectric elements 40 and 60 respectively in the surface region of the semiconductor chip 11 is placed on the lead frame 20 with the surface region facing away from the lead frame 20. The first and second photoelectric elements 40 and 60 of the semiconductor chip 11 are exposed to the two different wavelength lights so as to move the semiconductor chip 11 toward the chip guide 27a by respective interactions between the magnetic fields of the first and second solenoids 42 and 62 and magnetic fields, referred to as second magnetic fields, of the electromagnets 26a and 26b. While the contact between the semiconductor chip 11 and the chip guide 27a may be maintained, the semiconductor chip 11 may bonded to the lead frame 20 by heating and hardening the adhesive 22 on the lead frame 20. The wire bonding to the semiconductor chip 11 is performed while keeping the position of the semiconductor chip 11 near the chip guide 27a. This sequential process is not necessarily limited to the above-mentioned one.

In this embodiment, when bonding of a semiconductor chip to a lead frame is carried out, an image of the semiconductor chip for positioning may not be necessary. Therefore, whenever patterns of semiconductor chips are changed, it may not be necessary to capture images of reference chips. It is also not necessary to check whether the image of the semiconductor for positioning mistakes for an image of an adjacent similar pattern. Moreover, after performing positioning, the semiconductor chip is not adsorbed and not conveyed. Therefore, since a position shift by an air flow of adsorbing is not caused, accumulation of inaccuracy of a position decreases. That is, indefiniteness and complicatedness of a positioning process by image recognition may be eliminated, and the semiconductor chip may be exactly placed in a predetermined position on the lead frame, according to this embodiment.

Figure 7A:
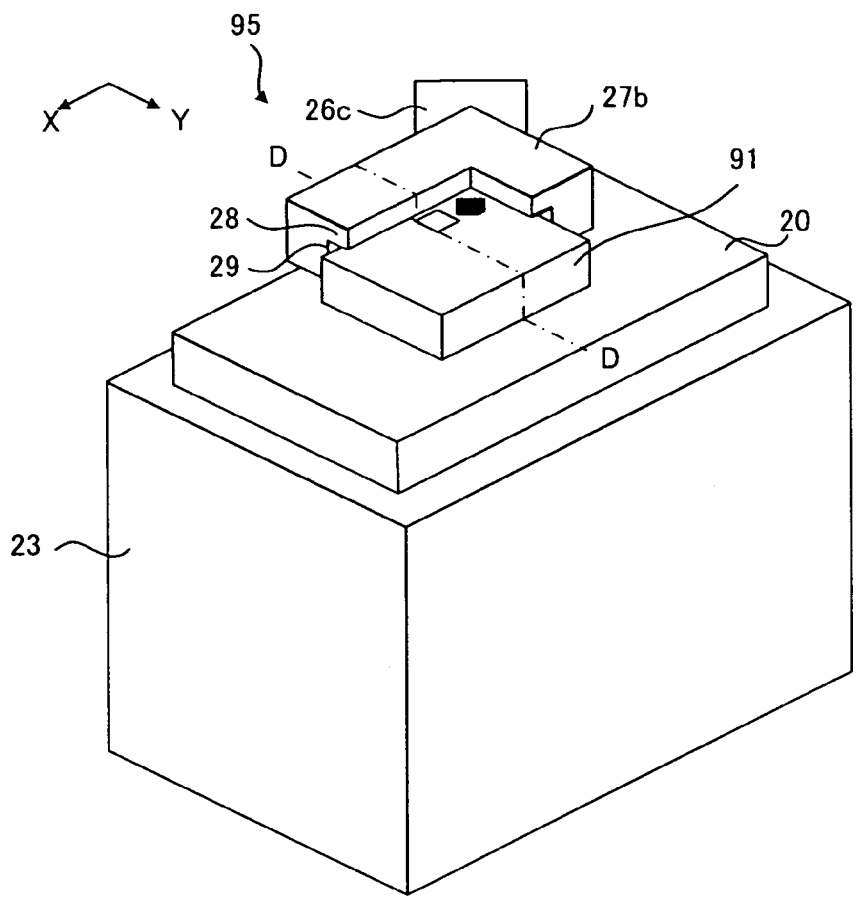
FIG. 7A is a simplified perspective view showing a positioning mechanism of a semiconductor chip and its related parts used in the second embodiment of the present invention.
Figure 7B:
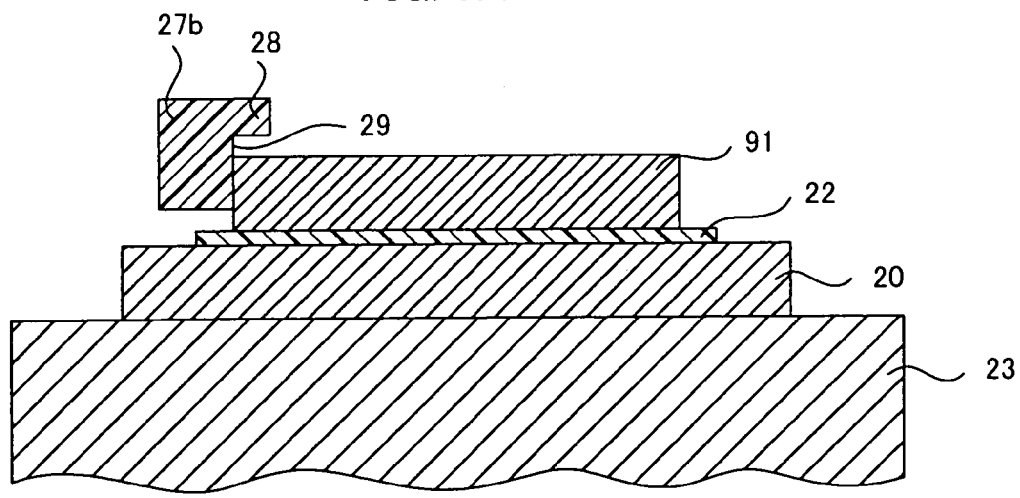
FIG. 7B is a sectional view along a dashed dofted line (D-D) portion of in FIG. 7A.

A second embodiment in accordance with the present invention will be explained with reference to FIG. 7 through FIG. 10. FIG. 7A is a simplified perspective view showing a positioning mechanism of a semiconductor chip and its related parts used in the second embodiment of the present invention. FIG. 7B is a sectional view along a dashed dotted line (D-D) portion in FIG. 7A.

A difference from the first embodiment is that a pair of a photoelectric element and a solenoid in the semiconductor chip is formed, an electromagnet is arranged outside the semiconductor chip, and positioning of the semiconductor chip to the lead frame is performed using the pair of the photoelectric element and the solenoid and the electromagnet. The same reference numerals and marks are given to the corresponding components and elements to those of the first embodiment, and the description about them is omitted.

Semiconductor chip-bonding equipment used in this embodiment has the same mechanism as that using in the first embodiment except the positioning mechanism. One electromagnet is used for the positioning mechanism, and therefore a position where the electromagnet is placed in a chip guide is different.

As shown in FIG. 7A and FIG. 7B, a lead frame 20 is on a bonding table 23, an adhesive 22 is on the lead frame 20 that the semiconductor chip 91 is to be laid, and the semiconductor chip 91 is on the adhesive 22. A chip guide 27b, which is, for example, made of resin material, of the positioning mechanism 95 has an L-shaped form extended in the X direction and the Y direction. The chip guide 27b plays a role of a reference position for positioning the semiconductor chip 91. The chip guide 27b is arranged above the semiconductor chip 91. A guide side 29, having two faces, of the chip guide 27b is for contacting two adjacent sides of the semiconductor chip 91. The chip guide 27b has eaves 28.

An electromagnet 26c which has an end at an intersection of the two faces of the guide side 29 separates from the two faces of the guide side 29 about 135 degrees, respectively, that is the electromagnet 26c obliquely faces the guide side 29. If a top surface form of the semiconductor chip 91 is greatly shifted from the square, however, the direction of the electromagnet 26c may be adjusted so as to unite in the direction of a diagonal line of the top surface. The electromagnet 26c has a solenoid (not shown in the figure) inside. Through a controller 35, the poles of the electromagnet 26c can be changed by changing current directions and the magnetic field strength of the electromagnet 26c can be changed by changing amount of the current.

Figure 8:
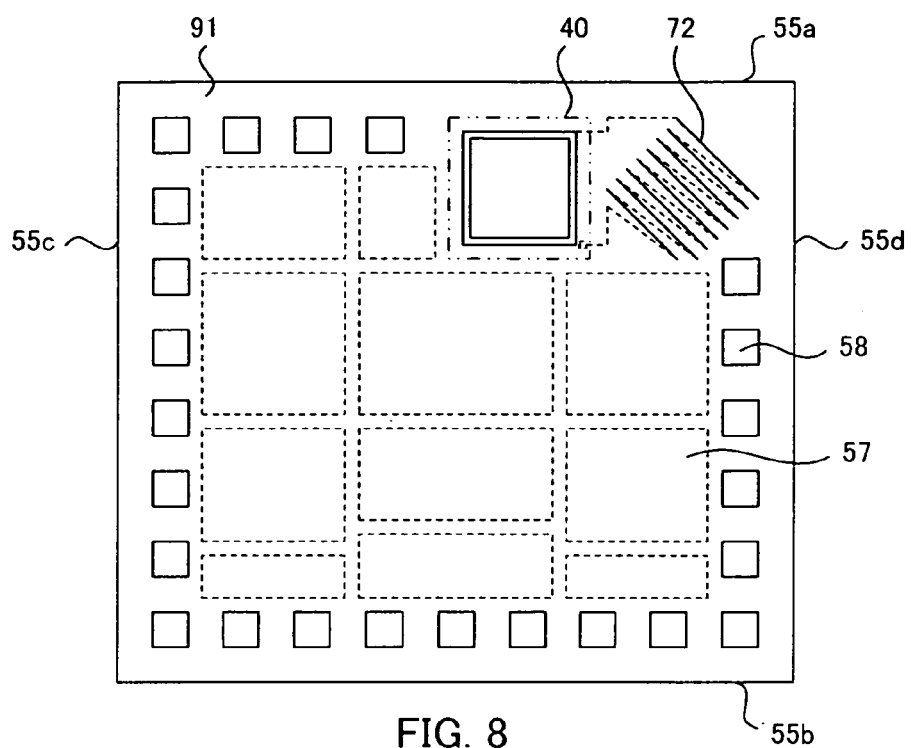
FIG. 8 is a plan view of the semiconductor chip used in the second embodiment of the present invention.

Elements in the surface region of the semiconductor chip 91 will now be explained. FIG. 8 is a plan view of a surface region of the semiconductor chip 91. As shown in FIG. 8, a photoelectric element 40 which generates a driving force for positioning, a solenoid 72 connected to this, functional blocks 57, bonding pads 58, etc. are formed in the surface region of the semiconductor chip 91. The solenoid 72 next to the photoelectric element 40 is arranged close to an upside 55a and a right-hand side 55d of the semiconductor chip 91 so that the solenoid 72 is face to face with the electromagnet 26c of the positioning mechanism 95 shown in FIG. 7. Coils of the solenoids 72 have a depth in a direction from the surface to the bottom of the semiconductor chip 91, and solid lines and dashed lines show shallower portions of the coils and deeper portions of the coils, respectively.

When a current generated in the photoelectric element 40 is passed, the solenoid 72 generates a magnetic field. The magnetic field inside the solenoid 72 is nearly in a direction toward an intersection of a downside 55b and a left-hand side 55c of the semiconductor chip 91, that is a side of the solenoid 72 close to an intersection of the upside 55a and the right-hand side 55d is set as S pole of the solenoid 72.

Figure 9A:
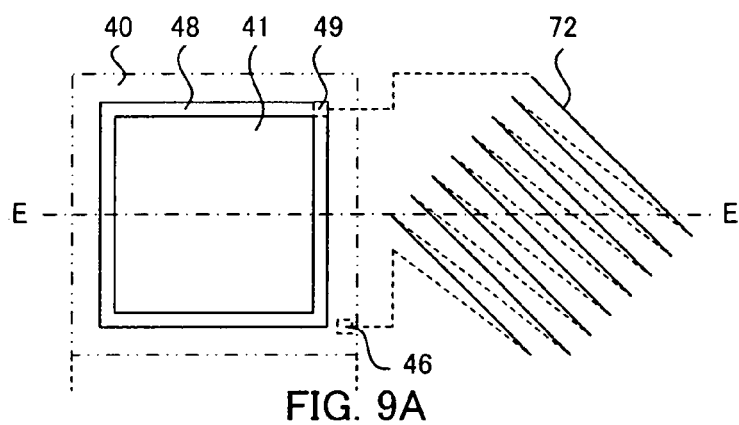
FIG. 9A is a plan view which shows a photoelectric element and a solenoid in the semiconductor chip of FIG. 8.
Figure 9B:
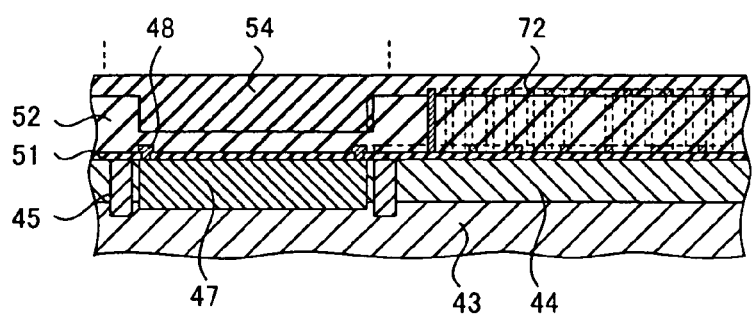
FIG. 9B is a sectional view along a dashed dotted line (E-E) portion of in FIG. 9A.

The plane and the cross-sectional structures of the photoelectric element 40 and the solenoid 72 will now be explained. FIG. 9A and FIG. 9B are a plan view and a sectional view, respectively, which show the photoelectric element 40 and the solenoid 72 on the semiconductor substrate 43. As shown in FIG. 9A, the photoelectric element 40, such as a photovoltaic device, is formed on the left-hand side, and the solenoid 72 spirally rolled in the diagonally right down direction is formed on the right-hand side. The magnetic field in the solenoid 72 turns to a direction of about 45 degrees from two adjacent sides, for example, the upside 55a and the right-hand side 55d, of the semiconductor chip 91, respectively. If the top surface of the semiconductor chip 91 is close to a square, the magnetic field mostly coincides with the direction of a diagonal line of the top surface. If the top surface has fairly shifted from the square, however, the solenoid 72 may be desirable to form so that the direction of the magnetic field which is generated in the solenoid 72 may coincide with that of the diagonal line of the top surface.

The form of the solenoid 72 is almost the same as that where the solenoid 42 shown in FIG. 4 is rotated about 45 degrees. The solenoid 72 occupies an area which is nearly equivalent to that of the photoelectric element 40.

Figure 10A:
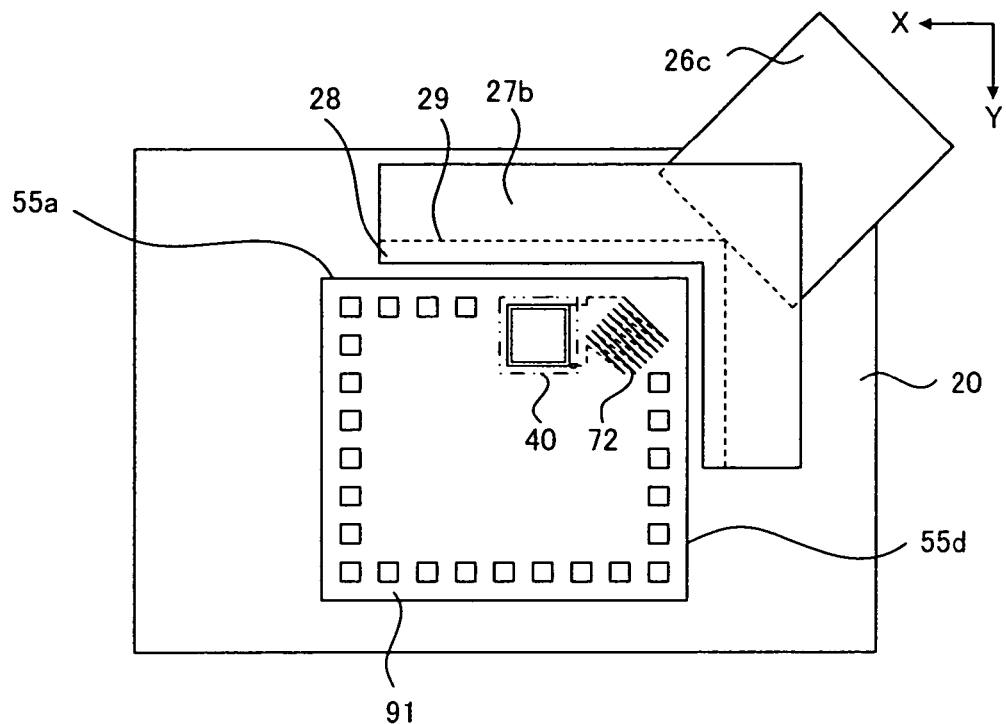
FIG. 10A is a plan view which shows a relationship between the semiconductor chip and a chip guide before the semiconductor chip is moved and positioned on a lead frame.
Figure 10B:
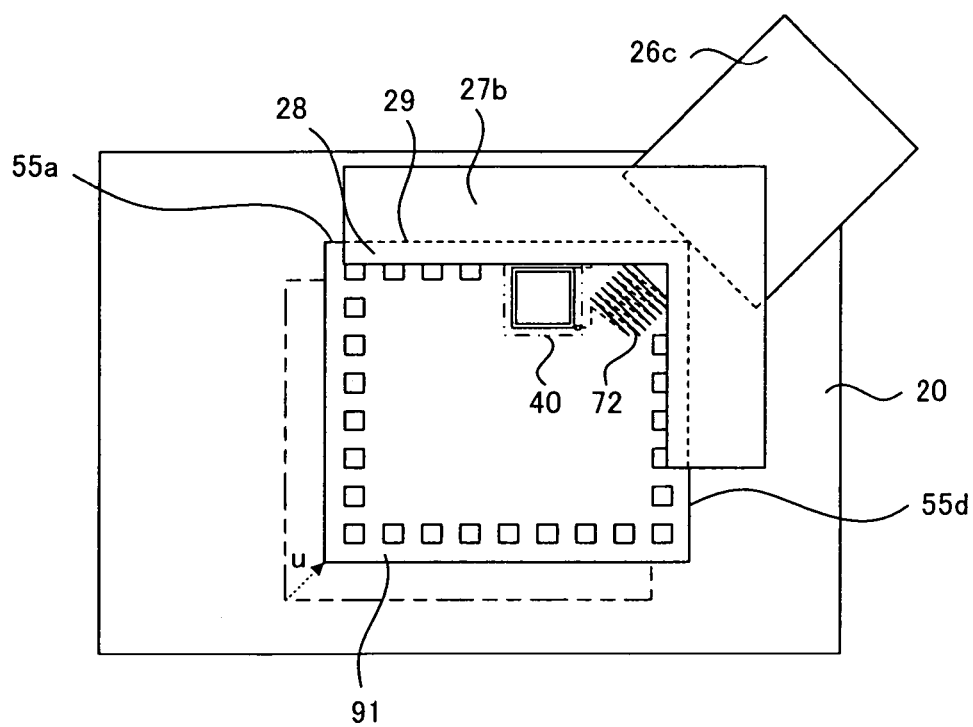

Method and operation with which the semiconductor chip 91 is moved using magnetic field and set in a predetermined position on the lead frame 20 will be explained. FIG. 10A is a plan view which shows a relationship between the semiconductor chip 91 and the chip guide 27b before the semiconductor chip 91 is moved and positioned on the lead frame 20. FIG. 10B is a plan view of the same relationship as FIG. 10A after that. As shown in FIG. 10A, the semiconductor chip 91 is conveyed onto the paste-like adhesive (not shown in the figure) on the lead frame 20 according to the conveyance mechanism 15, and is laid close to the guide side 29 below the L-shaped eaves 28.

The solenoid 72 of the semiconductor chip 91 has S pole close to the intersection of the upside 55a and the right-hand side 55d or in a direction to the electromagnet 26c, and therefore an end, which is attached to the chip guide 27b, of the electromagnet 26c which is opposed to the solenoid 72 is set to be N pole.

The semiconductor chip 91 is irradiated with the near-infrared light by the irradiation mechanism 30, while a current is passed on the electromagnet 26c. The S pole generated in the solenoid 72 can be attracted to the electromagnet 26c. Therefore the semiconductor chip 91 is moved toward the electromagnet 26c and stopped by the guide side 29 which is extended in the vertical (Y) direction and the horizontal (X) direction of the chip guide 27b.

As a result of the continuous operations, as shown in FIG. 10B, the semiconductor chip 91 moves by a distance u in the direction of a composition of −X and −Y to the guide side 29 of the chip guide 27b, and the semiconductor chip 91 is stopped by the faces of the guide side 29. As a result of the continuous operations, however, if the semiconductor chip 91 could not touch the faces of the guide side 29, or separates from the faces of the guide side 29 after hitting them, by repeating the continuous operations the semiconductor chip 91 may touch the faces of the guide side 29. Moreover, it is also possible to move the semiconductor chip 91 by turning the near-infrared light on and off while the current is passed on the electromagnets 26c. According to a slide condition of the sides of the semiconductor chip 91 to the guide side 29 of the chip guide 27b, operational sequences of the irradiation mechanism 30 and the positioning mechanism 25 may be decided and carried out by the controller 35.

The adhesive 22 may be heated and hardened under an attraction between the magnetic field of the solenoid 72 and the electromagnet 26c. Otherwise, the adhesive 22 may be heated and hardened under no attraction between them.

As mentioned above, the same effectiveness as in the first embodiment may be obtained in this embodiment. Moreover, since the positioning of the semiconductor chip may be carried out by a pair of the photoelectric element and the solenoid, it may be possible to reduce an area occupied by the photoelectric element and the solenoid in the semiconductor chip.

Figure 11B:
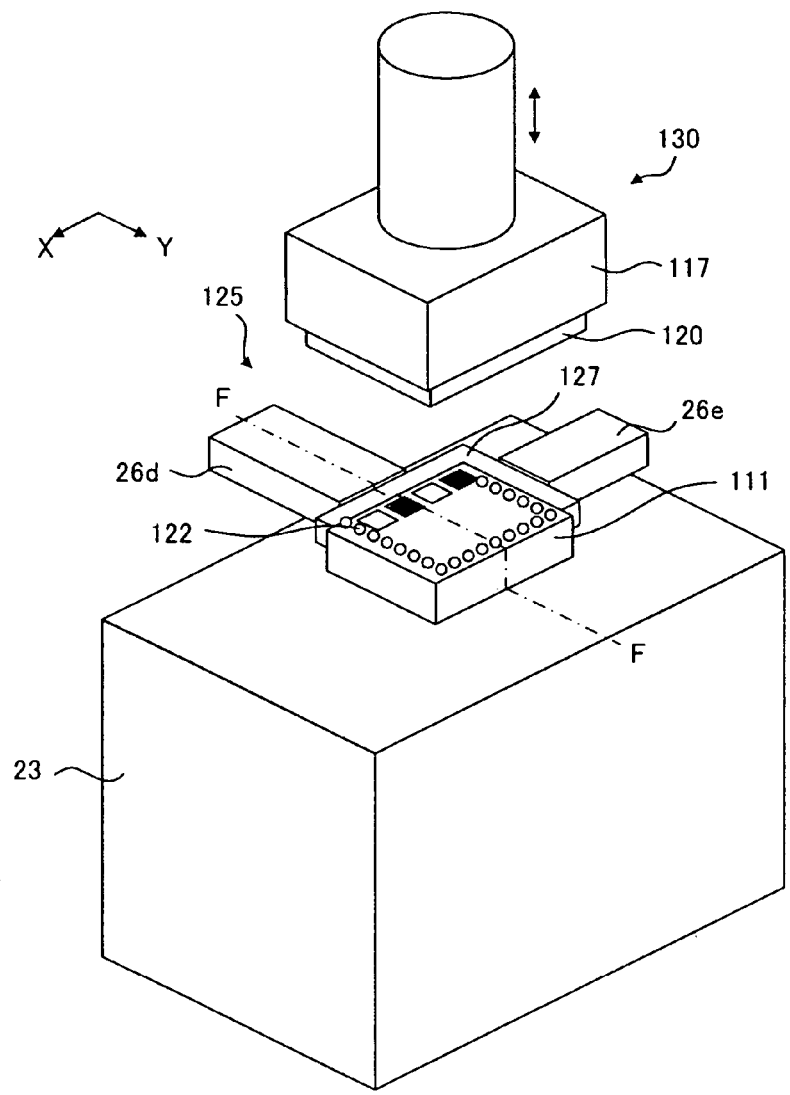
FIG. 11B is a sectional view along a dashed dotted line (F-F) portion of in FIG. 11A.
Figure 11B:
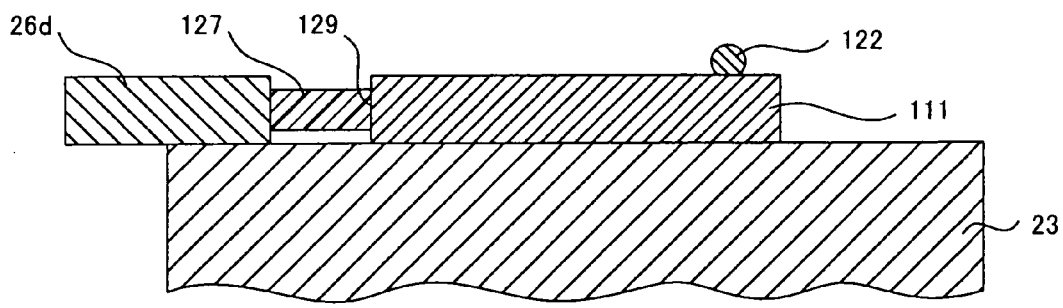
Figure 12:
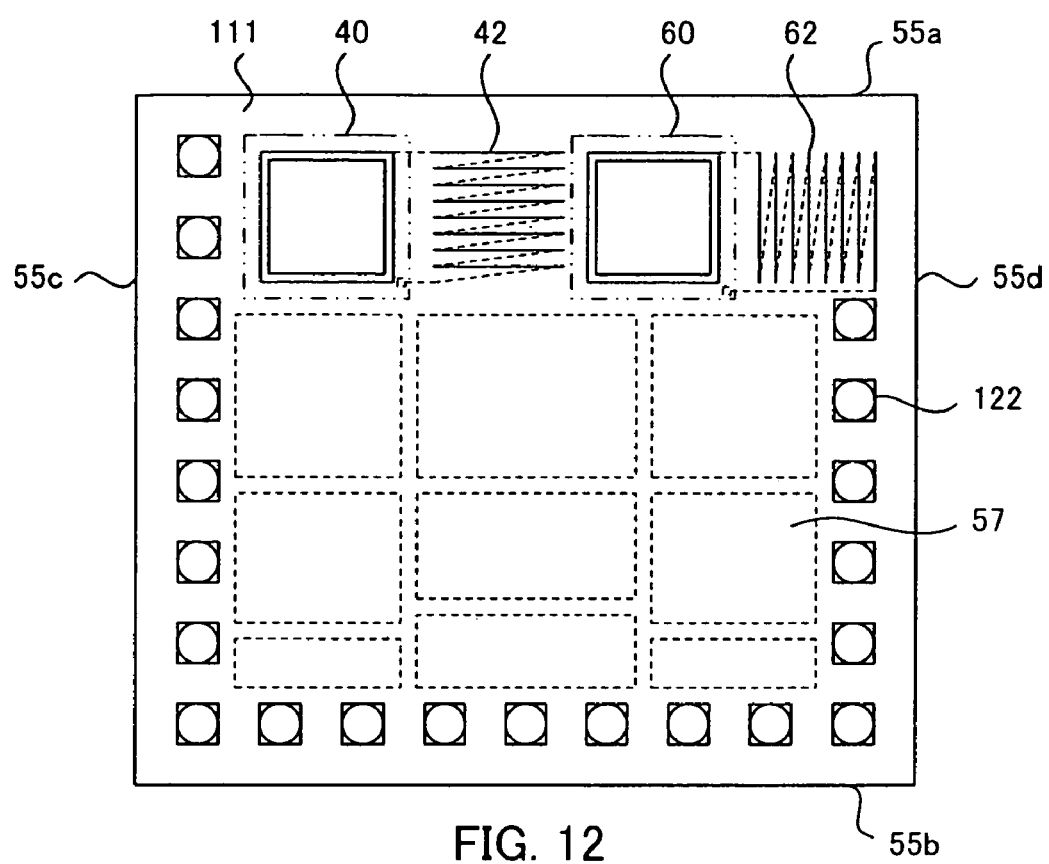
FIG. 12 is a plan view of the semiconductor chip used in the third embodiment of the present invention.

A third embodiment in accordance with the present invention will be explained with reference to FIG. 11 and FIG. 12. FIG. 11A is a simplified perspective view showing a positioning mechanism of a semiconductor chip and its related parts used in the third embodiment of the present invention. FIG. 11B is a sectional view along a dashed dotted line (F-F) portion of in FIG. 11A. FIG. 11A shows a mechanism added for a flip chip (bump) bonding of the semiconductor chip after positioning the semiconductor chip.

A difference from the first embodiment is that bumps are formed on a surface region of the semiconductor chip in addition to being formed photoelectric elements and solenoids as in the first embodiment. Therefore a bump bonding to an interposer as a package substrate is carried out on the surface region of the semiconductor chip after positioning the semiconductor chip. In addition, the same reference numerals and marks are given to the corresponding components and elements as those of the first and second embodiments, and the description about them is omitted.

Semiconductor chip-bonding equipment used in this embodiment has the same mechanism as that using in the first embodiment except a bump bonding mechanism 130. As shown in FIG. 11, the bump bonding mechanism 130 has an adsorption and heating fixture 117 for adsorbing the interposer 120 and connecting to the bumps 122 on the semiconductor chip 111. The adsorption and heating fixture 117 is connected to a controller (for example, corresponding to the controller 35 in FIG. 1).

The bumps 122 which, for example, consist of solder balls are formed on bonding pads (not shown in the figure) at the surface region of the semiconductor chip 111. This semiconductor chip 111 which is on an adhesive tape (not shown in the figure) attached a ring-like frame may be laid on a chip supply table which is placed horizontally as shown in FIG. 1.

The positioning mechanism 25 arranged on a bonding table 23 will be explained. As shown in FIG. 11A and FIG. 11B, a chip guide 127 which is, for example, made of resin material, has an L-shaped form as a guide of positioning the semiconductor chip 111. The chip guide 127 with electromagnets 26d and 26e is arranged on or near the top surface of the bonding table 23, i.e. the chip guide 127 may be touched the bonding table 23 or may be placed at a distance which is within a thickness of the semiconductor chip 111. A guide side 129 of the chip guide 127 is to touch two sides of the semiconductor chip 111 like the first embodiment.

The two electromagnets 26d and 26e which have respective ends close to the guide side 129 of the chip guide 127 are perpendicular to adjacent two sides of the semiconductor chip 111, respectively, which faces the guide side 129; that is both the electromagnets 26d and 26e may be at right angles to each other. The electromagnets 26d and 26e have solenoids (not shown in the figure) inside. Through the controller, the poles of the electromagnets 26d and 26e can be changed by changing current directions and a magnetic field strength of the electromagnets 26d and 26e can be changed by changing amount of the currents. Magnetic fields of the electromagnets 26d and 26e are referred to as second magnetic fields.

By touching two sides of the semiconductor chip 111, the guide side 129 having two faces of the L-shaped form sets the semiconductor chip 111 in a position where the semiconductor chip 111 should be bonded to the interposer 120.

Elements in the surface region of the semiconductor chip 111 will be explained. FIG. 12 is a plan view of the surface region of the semiconductor chip 111. As shown in FIG. 12, the first and second photoelectric elements 40 and 60 which generate driving forces for positioning, the first and second solenoids 42 and 62 connected to these, respectively, functional blocks 57, the bumps 122 for the bump bonding, etc. are formed in the surface region of the semiconductor chip 111. The first and second solenoids 42 and 62 next to the first and second photoelectric elements 40 and 60, respectively, are arranged close to an upside 55a and a right-hand side 55d of the semiconductor chip 111 so that the first and second solenoids 42 and 62 are face to face with the electromagnets 26d and 26e of the positioning mechanism 125 shown in FIG. 11.

Method and operation with which the semiconductor chip 111 is moved using magnetic fields and set at a predetermined position on the bonding table 23 are similar to those of the first embodiment. That is, the semiconductor chip 111 is laid close to the guide side 129 of the faces of the L-shaped chip guide 127. Then the magnetic field generated in the first solenoid 42 is attracted to the electromagnet 26d outside the semiconductor chip 111. The magnetic field generated in the second solenoid 62 is attracted to the electromagnet 26e outside the semiconductor chip 111, and therefore the semiconductor chip 111 is positioned on a predetermined position.

A tip of an adsorption nozzle 17 of a conveyance mechanism 15 in FIG. 1 has a form which can adsorb the semiconductor chip 111 without contacting the bumps 122. It may be suitable to form resin and/or unevenness in the surface of the bonding table 23 in order to reduce contact friction with the semiconductor chip 111.

While the semiconductor chip 111 is on or almost on the guide side 129, the bumps 122 keep fused by being heated with a heating mechanism (not shown in the figure) in the top face of the bonding table 23. Then the bumps 122 of the semiconductor chip 111 contact the electrode (not shown in the figure) of the interposer 120 which is heated with the adsorption and heating fixture 117 and is taken down to approach the semiconductor chip 111. At the same time, before the semiconductor chip 111 and the electrode of the interposer 120 contact, the chip guide 127 may be off the semiconductor chip 111 which is still on the predetermined position. Then, the bumps 122 of the semiconductor chip 111 connect the electrode of the interposer 120 by cooling, for example, with the inert gas spraying, etc. (not shown in the figure). Then the interposer 120 with the semiconductor chip 111 is conveyed to a following process.

As mentioned above, the semiconductor chip 111 is placed close to the position in which the semiconductor chip 111 is to be laid on the bonding table 23, and as with the first embodiment the semiconductor chip 111 may touch the chip guide 27 installed on the predetermined position. The semiconductor chip 111 may be bonded to the predetermined position of the interposer 120 by fusing the bumps 122 on the semiconductor chip 11, contacting the interposer 120 to the bumps 122 and then solidifying the bumps 122.

The same effectiveness as in the first embodiment may be obtained in this embodiment, although there is the difference of substituting the lead frame with the interposer. Moreover it may become possible to apply to the chip bonding of the semiconductor chip in which the bumps are formed.

A pair of the photoelectric element and the solenoid which are formed on the semiconductor chip may be adopted for positioning of the semiconductor chip in this embodiment, as with the second embodiment. In this case, an electromagnet outside the semiconductor chip is also placed as in the second embodiment. It may be possible to reduce an area occupied by the photoelectric element and the solenoid on the semiconductor chip as in the second embodiment.

This invention is not limited to the above-mentioned embodiments, and within a range which do not deviate from the substance of this invention, various modification may be carried out.

For example, although the photoelectric elements or the solenoids are arranged at the edge of the semiconductor chip in the above-mentioned embodiments, they may be arranged in other places in the surface region of the semiconductor chip even. A pair of a photoelectric element and a solenoid may be arranged separating from each other.

Moreover, the magnetic field generated in the solenoid in the semiconductor chip may change by the number of turns (coils) of the solenoid, the conversion efficiency of the photoelectric element, the intensity of lighting, etc. The interaction of the solenoid with the external magnet may depend on the magnetic field strengths of the external magnet. Required magnetic fields may be decided by the size of the semiconductor chip to move, friction between contact surfaces, etc. Therefore, in consideration of those parameters, suitable dimensions and characteristics of the photoelectric elements and the solenoids on the semiconductor chip may be decided.

Although the mechanism which attaches the eaves on the chip guide was shown in the first and second embodiments, the eaves may not be indispensable by choosing the position of the electromagnets, their intensities and energization profiles appropriately.

The magnetic field generated inside the solenoid of the second embodiment turns to the direction close to the diagonal line of the top surface of the semiconductor chip, and crosses at about 45 degrees with the direction of the photoelectric element to the solenoid. In this case, however, the photoelectric element may be placed in the direction of the magnetic field of the solenoid.

In the above-mentioned embodiments, magnetic attractions are used; the magnetic pole of the solenoid in the semiconductor chip and the magnetic pole of the electromagnet outside and opposed to the semiconductor chip are set to be different from each other, therefore the electromagnet attracts the semiconductor chip toward the chip guide for positioning. On the other hand, magnetic repulsions may be used; if the magnetic pole of the solenoid and the magnetic pole of the electromagnet opposed to the semiconductor chip may be set to be same from each other, the repulsions of the electromagnet to the solenoid of the semiconductor chip may be caused, and then the repulsion may push the semiconductor chip to the chip guide for positioning. In this case, the electromagnet may need to be installed on the opposite side of the chip guide to the solenoid of the semiconductor chip, and the each external electromagnet may be installed in the each direction of the magnetic field generated in the solenoid in the semiconductor chip. Moreover, both the attractions and the repulsions may be used for moving the semiconductor chip.

Although the example which the solder bumps are formed on the semiconductor chip was shown, bumps formed with Au may be directly connected to electrodes formed with the same or different kind of metals on the interposer, for example, using a thermo-compression bonding. And the bumps formed with Au may also be connected to them via ACF's (Anisotropic Conductive Adhesive) or conductive pastes such as Ag paste.

Although a plane form of the light-sensitive area of the photoelectric element is a rectangle in the above-mentioned embodiments, it may be a circle, an ellipsoid or the like.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a semiconductor device containing a semiconductor chip, comprising:
   placing a package substrate in a first predetermined position on a supporting equipment;
   placing a chip guide equipment and a magnetic-field-generating equipment in a second predetermined position near the package substrate;
   placing on the package substrate a semiconductor chip having a photoelectric element and a solenoid electrically connected to the photoelectric element in a surface region of the semiconductor chip, with the surface region facing away from the package substrate;
   exposing the photoelectric element of the semiconductor chip to light so as to move the semiconductor chip toward the chip guide equipment by an interaction between a first magnetic field of the solenoid and a second magnetic field of the magnetic-field-generating equipment; and performing a manufacturing step to the semiconductor chip while keeping the position of the semiconductor chip near the chip guide equipment.

2. A method for fabricating a semiconductor device according to claim 1, wherein the magnetic-field-generating equipment contains a magnet including an electromagnet.

3. A method for fabricating a semiconductor device according to claim 2, wherein the interaction is an attraction.

4. A method for fabricating a semiconductor device according to claim 2, wherein the package substrate is applied with a thermosetting adhesive.

5. A method for fabricating a semiconductor device according to claim 4, further including conveying the semiconductor chip onto the adhesive on the package substrate by a conveyance mechanism.

6. A method for fabricating a semiconductor device according to claim 5, wherein the manufacturing step is a step for bonding the semiconductor chip to the package substrate by heating.

7. A method for fabricating a semiconductor device according to claim 2, wherein a direction of the first magnetic field generated inside the solenoid is substantially parallel to a side of a top surface of the semiconductor chip.

8. A method for fabricating a semiconductor device according to claim 2, wherein a direction of the first magnetic field generated inside the solenoid is substantially parallel to a line within a range between a diagonal line of a top surface of the semiconductor chip passing through a nearest corner to the solenoid and a line which crosses at the 45 degrees to a side of the top surface, is in a top surface and shares the corner.

9. A method for fabricating a semiconductor device according to claim 2, wherein the solenoid is formed in a periphery of the semiconductor chip.

10. A method for fabricating a semiconductor device according to claim 2, wherein the solenoid contains a first solenoid and a second solenoid, and directions of magnetic fields generated inside the first and second solenoids cross at an angle of substantially 90 degrees mutually.

11. A method for fabricating a semiconductor device according to claim 10, wherein a first photoelectric element connected to the first solenoid has relatively higher sensitivity to near-infrared light and a second photoelectric element connected to the second solenoid has relatively higher sensitivity to visible light.

12. A method of fabricating a semiconductor device containing a semiconductor chip, comprising:

placing a chip guide equipment and a magnetic-field-generating equipment in a predetermined position on or near a supporting equipment;

placing on the supporting equipment a semiconductor chip having a photoelectric element and a solenoid electrically connected to the photoelectric element in a surface region of the semiconductor chip, and a bump on the surface region, with the surface region facing away from the supporting equipment;

exposing the photoelectric element of the semiconductor chip to light so as to move the semiconductor chip toward the chip guide equipment by an interaction between a first magnetic field of the solenoid and a second magnetic field of the magnetic-field-generating equipment; and performing a manufacturing step to the semiconductor chip while keeping the position of the semiconductor chip near the chip guide equipment.

13. A method for fabricating a semiconductor device according to claim 12, wherein the magnetic-field-generating equipment contains a magnet including an electromagnet.

14. A method for fabricating a semiconductor device according to claim 13, wherein the interaction is an attraction.

15. A method for fabricating a semiconductor device according to claim 13, wherein the manufacturing step is a step for bonding the semiconductor chip to a package substrate with the bump.

16. A method for fabricating a semiconductor device according to claim 13, wherein a direction of the first magnetic field generated inside the solenoid is substantially parallel to a side of a top surface of the semiconductor chip.

17. A method for fabricating a semiconductor device according to claim 13, wherein the direction of the first magnetic field generated inside the solenoid is substantially parallel to a line within a range between a diagonal line of the top surface of the semiconductor chip passing through the nearest corner to the solenoid and a line which crosses at the 45 degrees to a side of the top surface, is in a top surface and shares a corner.

18. A method for fabricating a semiconductor device according to claim 13, wherein the solenoid is formed in a periphery of the semiconductor chip.

19. A method for fabricating a semiconductor device according to claim 13, wherein the solenoid contains of a first solenoid and a second solenoid and directions of the magnetic fields generated inside the first and second solenoids cross at an angle of substantially 90 degrees mutually.

20. A method for fabricating a semiconductor device according to claim 19, wherein the first photoelectric element has relatively higher sensitivity to infrared light and the second photoelectric element has relatively higher sensitivity to visible light.

* * * * *